United States Patent
Ding et al.

(10) Patent No.: US 11,393,699 B2
(45) Date of Patent: Jul. 19, 2022

(54) PACKAGING PROCESS FOR PLATING WITH SELECTIVE MOLDING

(71) Applicant: VISHAY GENERAL SEMICONDUCTOR, LLC, Malvern, PA (US)

(72) Inventors: Huiying Ding, Tianjin (CN); Junfeng Liu, Tianjin (CN); Longnan Jin, Tianjin (CN); Heinrich Karrer, Regau (AT); Thomas Schmidt, Leonding (AT)

(73) Assignee: VISHAY GENERAL SEMICONDUCTOR, LLC, Malvern, PA (US)

( * ) Notice: Subject to any disclaimer, the term of this patent is extended or adjusted under 35 U.S.C. 154(b) by 0 days.

(21) Appl. No.: 17/059,084

(22) PCT Filed: Feb. 7, 2020

(86) PCT No.: PCT/US2020/017135
§ 371 (c)(1),
(2) Date: Nov. 25, 2020

(87) PCT Pub. No.: WO2021/133420
PCT Pub. Date: Jul. 1, 2021

(65) Prior Publication Data
US 2021/0375641 A1    Dec. 2, 2021

(30) Foreign Application Priority Data
Dec. 24, 2019    (CN) .......................... 201911348978.6

(51) Int. Cl.
*H01L 21/48*    (2006.01)
*H01L 21/56*    (2006.01)
(Continued)

(52) U.S. Cl.
CPC ........ *H01L 21/4839* (2013.01); *H01L 21/561* (2013.01); *H01L 21/565* (2013.01);
(Continued)

(58) Field of Classification Search
CPC ... H01L 21/4839; H01L 21/561; H01L 21/78; H01L 23/3121; H01L 23/49534
See application file for complete search history.

(56) References Cited

U.S. PATENT DOCUMENTS

| 5,801,432 A | 9/1998 | Rostoker et al. |
| 5,976,912 A | 11/1999 | Fukutomi et al. |

(Continued)

FOREIGN PATENT DOCUMENTS

| EP | 1966743 B1 | 2/2011 |
| EP | 1958133 B1 | 3/2011 |

(Continued)

OTHER PUBLICATIONS

Rogren, Philip E. et al. "A High Performance and Cost Effective Molded Array Package Substrate." (2010).
(Continued)

*Primary Examiner* — Marc Anthony Armand
(74) *Attorney, Agent, or Firm* — Volpe Koenig

(57) ABSTRACT

Techniques and devices are disclosed for forming wettable flanks on no-leads semiconductor packages. A lead frame may include a plurality of lead sets, each lead set including leads having a die surface and a plating surface, vias between adjacent lead sets in a first direction, and an integrated circuit die arranged on the die surface of each die lead. A mold chase may be applied to the plating surfaces, the mold chase including mold chase extensions extending into the vias between each adjacent lead set in the first direction, each mold chase extension having a peak surface. The lead frame assembly may be partially embedded in a
(Continued)

mold encapsulation such that portions of the mold encapsulation contact the peak surfaces. The mold chase may be removed to expose the vias containing sidewalls and the plating surfaces and the sidewalls may be plated with an electrical plating.

10 Claims, 7 Drawing Sheets

(51) Int. Cl.
    *H01L 21/78*     (2006.01)
    *H01L 23/31*     (2006.01)
    *H01L 23/495*     (2006.01)
    *H01L 23/00*     (2006.01)

(52) U.S. Cl.
    CPC .......... *H01L 21/78* (2013.01); *H01L 23/3121* (2013.01); *H01L 23/49534* (2013.01); *H01L 24/48* (2013.01); *H01L 2224/48245* (2013.01); *H01L 2924/173* (2013.01)

(56) References Cited

U.S. PATENT DOCUMENTS

| | | | |
|---|---|---|---|
| 6,001,671 | A | 12/1999 | Fjelstad |
| 6,219,908 | B1 | 4/2001 | Farnworth et al. |
| 6,238,952 | B1 | 5/2001 | Lin |
| 6,400,004 | B1 | 6/2002 | Fan et al. |
| 6,498,099 | B1 | 12/2002 | McLellan et al. |
| 6,608,366 | B1 | 8/2003 | Fogelson et al. |
| 6,774,659 | B1 | 8/2004 | Chiang |
| 6,872,599 | B1 | 3/2005 | Li et al. |
| 6,888,231 | B2 | 5/2005 | Maeda |
| 6,987,034 | B1 | 1/2006 | Chiang |
| 7,119,421 | B2 | 10/2006 | Rohrmoser et al. |
| 7,183,630 | B1 | 2/2007 | Fogelson et al. |
| 7,645,635 | B2 | 1/2010 | Wood et al. |
| 7,816,186 | B2 | 10/2010 | San Antonio et al. |
| 7,943,431 | B2 | 5/2011 | San Antonio et al. |
| 8,017,447 | B1 | 9/2011 | Olsen |
| 8,071,427 | B2 | 12/2011 | Celaya et al. |
| 8,076,181 | B1 | 12/2011 | Pruitt et al. |
| 8,093,097 | B2 | 1/2012 | Lange et al. |
| 8,159,826 | B2 | 4/2012 | Dijkstra et al. |
| 8,329,509 | B2 | 12/2012 | Gong et al. |
| 8,395,399 | B2 | 3/2013 | Rousseville et al. |
| 8,436,460 | B1 | 5/2013 | Gamboa et al. |
| 8,437,141 | B2 | 5/2013 | Rogy et al. |
| 8,535,982 | B1 | 9/2013 | Abdo et al. |
| 8,541,786 | B2 | 9/2013 | Boomen et al. |
| 8,642,461 | B2 | 2/2014 | Huening |
| 8,685,795 | B2 | 4/2014 | Wang |
| 8,728,929 | B2 | 5/2014 | Van Kempen et al. |
| 8,809,121 | B2 | 8/2014 | Li et al. |
| 8,968,510 | B2 | 3/2015 | Rogy et al. |
| 9,006,034 | B1 | 4/2015 | Sirinorakul |
| 9,018,537 | B2 | 4/2015 | Karrer |
| 9,070,669 | B2 | 6/2015 | Daniels et al. |
| 9,099,486 | B2 | 8/2015 | Merz et al. |
| 9,153,529 | B2 | 10/2015 | Van Kempen et al. |
| 9,206,794 | B2 | 12/2015 | Gridelet |
| 9,281,284 | B2 | 3/2016 | Yap et al. |
| 9,287,200 | B2 | 3/2016 | Higgins, III |
| 9,324,637 | B1 | 4/2016 | Bai et al. |
| 9,379,071 | B2 | 6/2016 | Kamphuis et al. |
| 9,391,007 | B1 | 7/2016 | Yeung et al. |
| 9,418,919 | B2 | 8/2016 | Groenhuis et al. |
| 9,425,130 | B2 | 8/2016 | Leung et al. |
| 9,443,791 | B2 | 9/2016 | Leung et al. |
| 9,461,009 | B1 | 10/2016 | Higgins, III et al. |
| 9,466,585 | B1 | 10/2016 | Kamphuis et al. |
| 9,472,528 | B2 | 10/2016 | Yap |
| 9,538,659 | B2 | 1/2017 | Viswanathan et al. |
| 9,606,079 | B2 | 3/2017 | Merz |
| 9,607,918 | B2 | 3/2017 | Gong et al. |
| 9,640,463 | B2 | 5/2017 | Lam et al. |
| 9,673,150 | B2 | 6/2017 | Gong et al. |
| 9,741,692 | B2 | 8/2017 | Karhade et al. |
| 9,779,349 | B2 | 10/2017 | Rogy et al. |
| 9,847,283 | B1 | 12/2017 | Ke et al. |
| 9,935,079 | B1 | 4/2018 | Foong et al. |
| 9,966,326 | B2 | 5/2018 | Mustanir et al. |
| 9,974,174 | B1 | 5/2018 | Wenzel et al. |
| 10,079,198 | B1 | 9/2018 | Cadag et al. |
| 10,083,866 | B2 | 9/2018 | Bin Mohd Arshad et al. |
| 10,410,941 | B2 | 9/2019 | Leung et al. |
| 2002/0063315 | A1 | 5/2002 | Huang et al. |
| 2003/0006055 | A1 | 1/2003 | Chien-Hung et al. |
| 2004/0046240 | A1 | 3/2004 | Hasebe et al. |
| 2005/0116321 | A1 | 6/2005 | Li et al. |
| 2005/0218499 | A1 | 10/2005 | Chang |
| 2007/0126092 | A1 | 6/2007 | San Antonio et al. |
| 2008/0206588 | A1 | 8/2008 | Lange et al. |
| 2008/0230926 | A1 | 9/2008 | Dijkstra et al. |
| 2008/0258273 | A1 | 10/2008 | Liang |
| 2008/0268578 | A1 | 10/2008 | Shimanuki et al. |
| 2008/0308310 | A1 | 12/2008 | Rogy et al. |
| 2008/0309462 | A1 | 12/2008 | Rogy et al. |
| 2010/0187663 | A1 | 7/2010 | Celaya et al. |
| 2010/0253372 | A1 | 10/2010 | Rousseville et al. |
| 2011/0033315 | A1 | 2/2011 | Gridelet |
| 2011/0147925 | A1 | 6/2011 | Van Kempen et al. |
| 2011/0244629 | A1 | 10/2011 | Gong et al. |
| 2011/0309514 | A1 | 12/2011 | Boomen et al. |
| 2012/0181678 | A1 | 7/2012 | Groenhuis et al. |
| 2013/0292553 | A1* | 11/2013 | Chang .................. H01L 31/12 250/216 |
| 2013/0334619 | A1 | 12/2013 | Merz et al. |
| 2013/0334695 | A1 | 12/2013 | Tijssen et al. |
| 2013/0341734 | A1 | 12/2013 | Merz |
| 2014/0167238 | A1 | 6/2014 | Jeon et al. |
| 2014/0357022 | A1 | 12/2014 | Stacey |
| 2015/0303156 | A1 | 10/2015 | Kamphuis et al. |
| 2016/0005679 | A1 | 1/2016 | Israel et al. |
| 2016/0035651 | A1 | 2/2016 | Leung et al. |
| 2016/0181122 | A1 | 6/2016 | Eugene Lee et al. |
| 2016/0218008 | A1 | 7/2016 | Li et al. |
| 2016/0276251 | A1 | 9/2016 | Mustanir et al. |
| 2016/0372403 | A1 | 12/2016 | Lam et al. |
| 2017/0005030 | A1 | 1/2017 | Kitnarong et al. |
| 2017/0107628 | A1 | 4/2017 | Trinidad |
| 2017/0338170 | A1 | 11/2017 | Ziglioli |
| 2017/0358514 | A1 | 12/2017 | Yeung et al. |
| 2017/0372988 | A1 | 12/2017 | Groenhuis et al. |
| 2018/0033647 | A1 | 2/2018 | Bin Mohd Arshad et al. |
| 2018/0068920 | A1 | 3/2018 | Leung et al. |
| 2018/0102287 | A1 | 4/2018 | Santos et al. |
| 2018/0358286 | A1* | 12/2018 | Cadag .................. H01L 21/4853 |

FOREIGN PATENT DOCUMENTS

| | | |
|---|---|---|
| EP | 2337068 A1 | 6/2011 |
| EP | 2361000 A1 | 8/2011 |
| EP | 2400534 A1 | 12/2011 |
| EP | 2677540 A1 | 12/2013 |
| EP | 2693465 A1 | 2/2014 |
| EP | 2677307 B1 | 5/2016 |
| EP | 3051592 A1 | 8/2016 |
| EP | 2677306 B1 | 11/2017 |
| EP | 3261115 A1 | 12/2017 |
| EP | 3293760 A1 | 3/2018 |
| EP | 3306660 A2 | 4/2018 |
| EP | 3319122 B1 | 6/2019 |
| EP | 2704192 B1 | 7/2019 |
| WO | 2006/134534 A1 | 12/2006 |
| WO | 2007/052234 A2 | 5/2007 |
| WO | 2007/060631 A1 | 5/2007 |
| WO | 2009/072052 A1 | 6/2009 |
| WO | 2009/133499 A2 | 11/2009 |
| WO | 2009/144672 A1 | 12/2009 |

(56) References Cited

FOREIGN PATENT DOCUMENTS

| WO | 2010/032192 A1 | 3/2010 |
| WO | 2020/185192 A1 | 9/2020 |
| WO | 2020/185193 A1 | 9/2020 |

OTHER PUBLICATIONS

Koschmieder et al., "Soldering the QFN Stacked Die Sensors to a PC Board," Freescale Semiconductor Application Note, AN3111, Rev. 5 (Apr. 2010).
NXP Semiconductors, "Surface Mount Reflow Soldering," Application Note, Rev. 6, AN10365 (Jul. 30, 2012).
Chip Scale Review, The Future of Semiconductor Packaging, vol. 18, No. 6, (Nov.-Dec. 2014).
Janóczki et al., "Automatic Optical Inspection of Soldering," (2013).
Amkor MicroLeadFrame® Data Sheet, DS572S (2017).
Cision PRWeb, "NXP Introduces LIN Transceiver for Smaller, Lighter and More Cost-Efficient ECU Designs," (Feb. 23, 2012).
NXP Semiconductors, TJA1027: LIN 2.2A/SAE J2602 transceiver, Product data sheet, Rev. 2 (Apr. 24, 2013).
International Search Report and Written Opinion dated Jun. 5, 2020 for PCT International Application No. PCT/US2020/017135.
J. Ganjei, "Improved QFN Reliability by flank tin plating process after singulation," 2015 10th International Microsystems, Packaging, Assembly and Circuits Technology Conference (IMPACT), 2015, pp. 137-140.
Search Report issued in corresponding European Patent Application No. 20848929.4 dated Jun. 1, 2022, consisting of 9 pp.

* cited by examiner

US 11,393,699 B2

PACKAGING PROCESS FOR PLATING WITH SELECTIVE MOLDING

CROSS REFERENCE TO RELATED APPLICATIONS

This application is a 371 U.S. National Phase of International Application No. PCT/US2020/017135, filed on Feb. 7, 2020, which claims priority to Chinese Patent Application No. 201911348978.6, filed Dec. 24, 2019, which are incorporated by reference as if fully set forth.

BACKGROUND

Flat "no-leads" or "leadless" semiconductor die packages electrically and physically couple integrated circuit dies (or "dice") to printed circuit boards ("PCB") with flat leads and without through holes extending through a printed circuit board (PCB). Although these semiconductor die packages are referred to as "no-leads" or "leadless" packages, the term "leads" in the present disclosure is used to refer to the flat contact pads present on flat no-leads packages. These semiconductor die packages have no "leads" in the sense that there are no leads that extend past or beyond the outer periphery of the package. Flat no-leads packages may be classified as quad flat no-leads ("QFN") packages, having leads on all four sides of the package, and dual flat no-leads ("DFN") packages, having leads on two opposing sides. Within these semiconductor die packages, one or more integrated circuit dies is encapsulated within a non-conductive molding material. An electrically conductive lead frame, typically made of a metal like copper, is electrically coupled to internal components of the semiconductor die package and exposes leads externally that can be electrically coupled to a PCB. Improvements to flat no-leads packages are constantly being made.

Leadless semiconductor die packages have several advantages over packages having leads extending beyond a perimeter of the package. Such semiconductor die packages may have a low profile as compared to other types of semiconductor die packages. Such semiconductor die packages may take up less space and thereby have a smaller "footprint" on a printed circuit board than conventional packages having leads extending beyond the perimeter of the semiconductor die packages. Such leadless semiconductor die packages may also have better thermal performance as compared to packages having leads extending beyond the perimeter of the package.

An issue within the relevant industry as it concerns QFN and DFN packages relates to the inspection of the solder connections to the leads of the packages. In order to ensure proper solder connections to QFN and DFN packages, it is necessary to inspect the connections. These inspections can be performed by x-ray, for example, or by automated optical inspection (AOI). Automated optical inspection (AOI) systems are used to inspect, for example, semiconductor devices and printed circuit boards (PCBs), for defects. QFN and DFN packages can allow for AOI, which is less costly than x-ray inspections, if the leads are oriented in such a manner that the portions of the sides or "flanks" of the leads are wettable by solder, such as by having solder wick up the sides or sidewalls of the exposed leads.

Conventional lead wettable devices may be formed by processes which require one or more cuts prior to plating one or more surfaces to create wettable flanks. Such cuts may require additional equipment or may require a greater number of steps to create the wettable flanks.

There is therefore the need for an efficient method of manufacturing a semiconductor die packages having wettable flanks.

SUMMARY

In an aspect of the present invention, a method for fabricating lead wettable surfaces is disclosed. The method may include providing a lead frame including a plurality of lead sets, each lead set including a die lead and bond lead having a die surface and a plating surface, vias between adjacent lead sets in a first direction, and an integrated circuit die arranged on the die surface of each die lead. The method may further include applying a mold chase to the plating surface of each of the die leads and the bond leads, the mold chase contacting the plurality of lead sets, the mold chase including mold chase extensions extending into the vias between each adjacent lead set in the first direction, each mold chase extension having a peak surface. The method may further include partially embedding the lead frame assembly in a mold encapsulation such that portions of the mold encapsulation contact the peak surface of each of the mold chase extensions. The method may further include removing the mold chase to expose the vias, each via comprising a first lead sidewall of the die lead of each lead set and the second lead sidewall of the bond lead of each lead set and plating the plating surface of each of the die leads and the bond leads and plating the first lead sidewall and the second lead sidewall with an electrical plating.

In an aspect of the present invention, a device is disclosed that includes a lead frame including a plurality of lead sets, each lead set including a die lead and bond lead having a die surface and a plating surface, vias between adjacent lead sets in a first direction, and an integrated circuit die arranged on the die surface of each die lead. The device also includes a mold chase on the plating surface of each of the die leads and the bond leads, the mold chase contacting the plurality of lead sets, the mold chase including mold chase extensions extending into the vias between each adjacent lead set in the first direction, each mold chase extension having a peak surface and a mold encapsulation comprising portions of the mold encapsulation that contact the peak surface of each of the mold chase extensions.

BRIEF DESCRIPTION OF THE DRAWINGS

A more detailed understanding can be had from the following description, given by way of example in conjunction with the accompanying drawings wherein.

DETAILED DESCRIPTION

Figure 1:
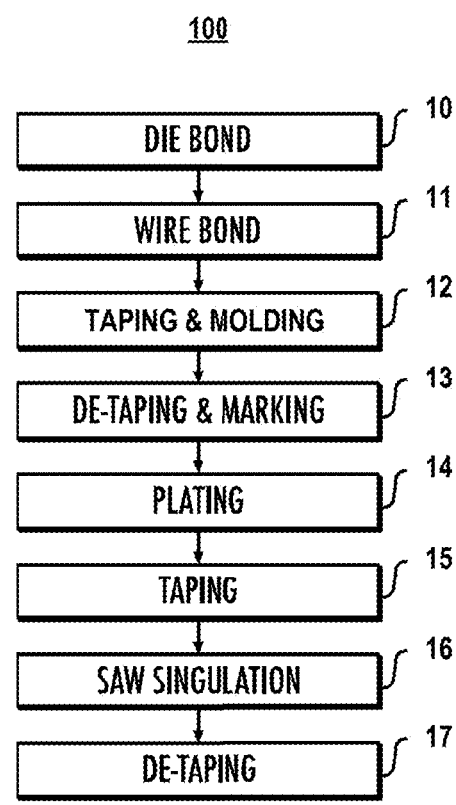
FIG. 1 is a flow diagram of an illustrative method for forming wettable flanks on a semiconductor die package from a package assembly, according to an example.

Certain terminology is used in the following description for convenience only and is not limiting. The words "right," "left," "top," and "bottom" designate directions in the drawings to which reference is made. However, it will be understood that such orientation-based terms are for reference only and that the embodiments may be implemented in different directions such that such terms may be applied as adjusted based on such respective different directions. The words "a" and "one," as used in the claims and in the corresponding portions of the specification, are defined as including one or more of the referenced item unless specifically stated otherwise. This terminology includes the words above specifically mentioned, derivatives thereof, and words of similar import. The phrase "at least one" followed by a list of two or more items, such as "A, B, or C," means any individual one of A, B or C as well as any combination thereof.

The description provided herein is to enable those skilled in the art to make and use the described embodiments set forth. Various modifications, equivalents, variations, combinations, and alternatives, however, will remain readily apparent to those skilled in the art. Any and all such modifications, variations, equivalents, combinations, and alternatives are intended to fall within the spirit and scope of the present invention defined by claims.

Techniques are disclosed herein for forming bottom and sidewall wettable flanks on semiconductor die packages, and, preferably, DFN and/or QFN semiconductor die packages. The techniques include a package assembly having multiple non-singulated semiconductor die packages. The package assembly includes a lead frame having dies and other internal package components (e.g., wire bonds) coupled thereto. The dies and other components form different regions of non-singulated semiconductor die packages, as further disclosed herein. The lead frame provides a continuous electrical connection between one end of the package assembly and the other, and between the various exposed leads and die paddles of the semiconductor die packages. Elements such as wire bonds or tie bars may assist with forming the electrical connection. This electrical connection may be used for current flow during electroplating, which may be a step that occurs in the process for forming bottom and sidewall wettable flanks on DFN and/or QFN packages.

FIG. 1 shows a flow diagram of a process 100 for forming a semiconductor die packages from a package assembly, according to an aspect of the present invention. The process 100 of FIG. 1 is discussed in conjunction with FIGS. 2-9, which illustrate stages of a package assembly 200 as the process 100 proceeds. A lead frame 25, as referenced herein, may be cut from a lead frame material such as a sheet of copper. A lead frame assembly, as referenced herein, may be the lead frame 25 having a plurality of lead sets 22 with first lead 22a and second lead 22b. The lead frame assembly may include any metal alloy. The lead sets 22 may be etched into portions of the lead frame 25. Although a lead set 22 is disclosed to include two leads (i.e., 22a and 22b), it will be understood that a lead set may include a different number of leads greater than one (e.g., 4 leads).

Figure 2A:
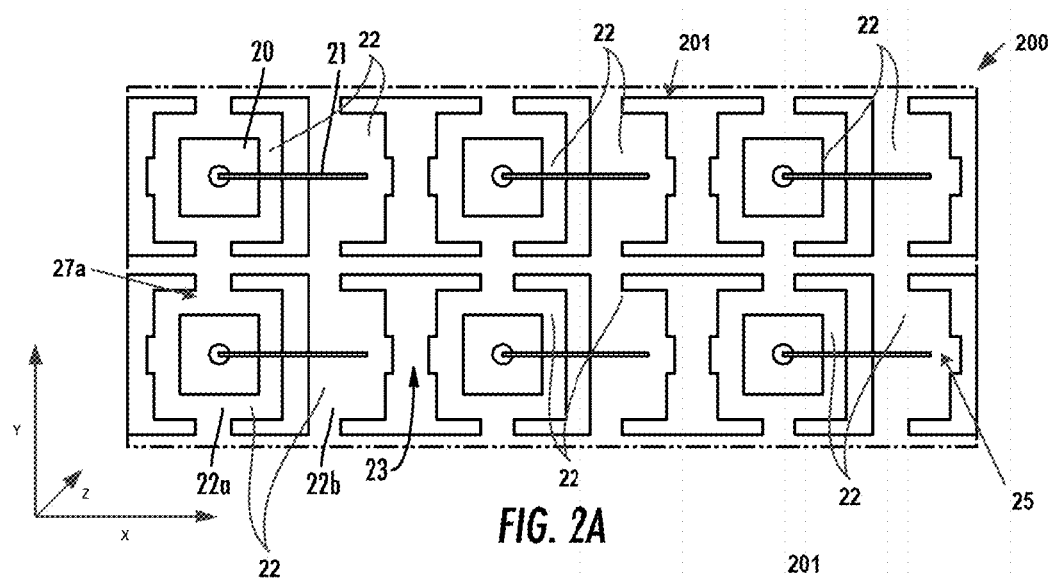
FIG. 2A is a top view of a package assembly illustrating a lead frame with leads, dies, and vias, according to an example.
Figure 2B:
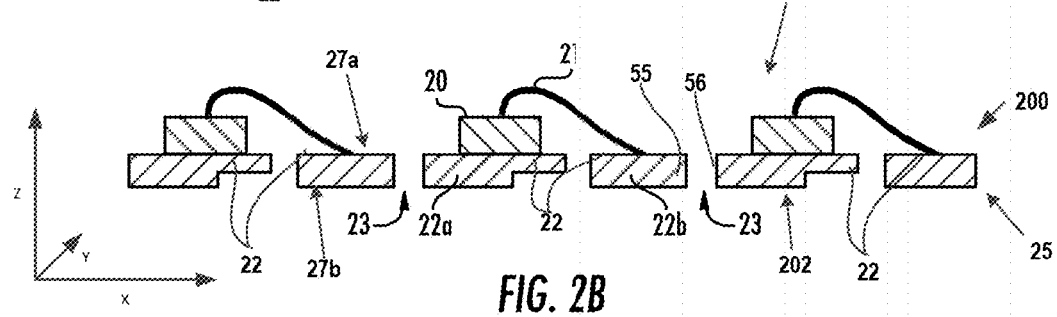
FIG. 2B is a cross-sectional view of the package assembly of FIG. 2A, according to an example.
Figure 2C:
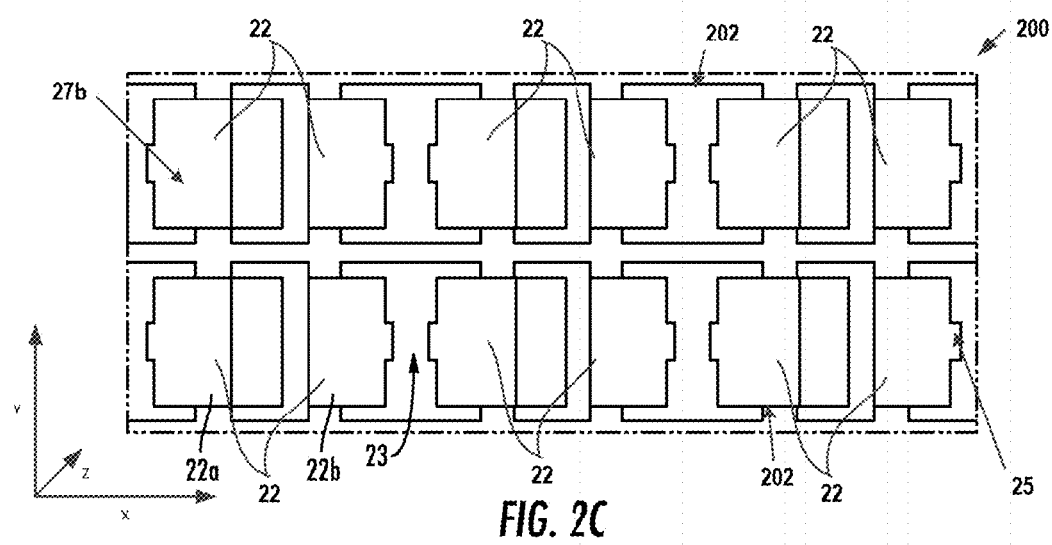
FIG. 2C is a bottom view of the package assembly of FIG. 2A, according to an example.

The package assembly 200 is shown with a top surface 201 and a bottom surface 202, as indicated in FIGS. 2A-2C. A lead frame 25 may include a plurality of lead sets 22, each lead set including at least a die lead 22a and a bond lead 22b. The lead frame 25 may include vias 23 between adjacent lead sets 22, as shown in FIGS. 2A-2C. The vias 23 may correspond to or otherwise be referred to as spaces, holes, through holes, gaps, voids, or the like. Each via 23 may be formed between sidewall 55 of bond leads 22b and sidewall 56 of die leads 22a of adjacent lead sets 22. Although the vias 23 are shown between adjacent lead sets 22 in the X direction in FIGS. 2A-C, it will be understood that vias 23 may be provided in a lead frame 25 in any applicable direction, such as the Y direction, and the examples shown in FIGS. 2-9 are not limiting.

Figure 3:
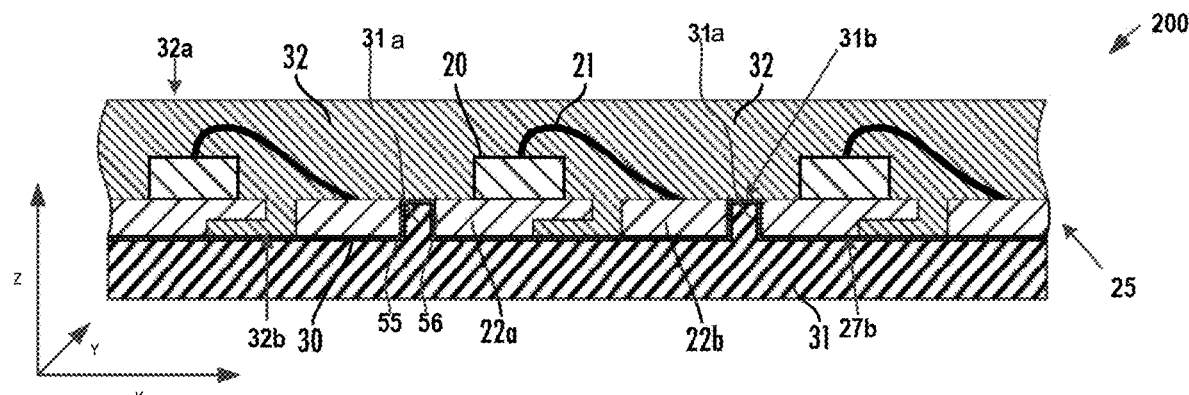
FIG. 3 is a cross-sectional view of a package assembly with a mold chase and mold encapsulation, according to an example.

At step 10, one or more of the integrated circuit dies 20, which are referred to herein as "dies", for simplicity, may be deposited on the die leads 22a of the lead sets 22 of the lead frame 25. The lead frame assembly may include multiple lead sets 22 integrated into a single part or unit. A plurality of semiconductor die packages may be formed in an array of die packages in the package assembly 200, which are then cut (e.g., singulated) into individual semiconductor die packages, as further disclosed herein. Each semiconductor die package may include a lead set 22 including a die lead 22a and a bond lead 22b, a die 20 on the die lead 22a, the die 20 bonded to the bond lead 22b via a wire 21 that connects the die 20 to the bond lead 22b. A mold encapsulation 32, as shown in FIG. 3, may also be part of a semiconductor die package, as further disclosed herein. A singulated semiconductor die package may be a semiconductor die package that is separated from one or more other semiconductor die packages in the package assembly, as further described herein.

At step 11, other components, such as wires 21, conductive clips (elements within the semiconductor die package that couple the die(s) to one or more leads), or other elements are deposited to form a plurality of semiconductor die packages. Notably, at step 11, each of a plurality of die 20 may be bonded to each corresponding bond lead 22b via a wire 21 that connects the die 20 to the bond lead 22b, as shown in FIGS. 2A and 2B.

FIG. 2A shows a top view of a package assembly 200 with a top surface 201, after step 11 of the process 100 of FIG. 1. As shown in FIG. 2A, a plurality of lead sets 22 are provided as part of a lead frame 25. Each lead set 22 includes a die lead 22a and a bond lead 22b. A die 20 is deposited on each of the die leads 22a on a die surface 27a (e.g., top surface, as shown in FIGS. 2A and 2B). As shown in FIG. 2B, dies 20 are deposited on die leads 22a of a lead sets 22 and the dies 20 are electrically connected to a bond lead 22b of the same lead set 22. The electrical connection may be implemented using wire 21 bonded to a given die 20 deposited on a die surface 27a of the die lead 22a of a lead set 22, the given wire 21 connecting to a die surface 27a of a bond lead 22b.

FIG. 2B shows a cross-sectional view of the package assembly 200 of FIG. 2A, after step 11 of the process 100 of FIG. 1. As shown in FIG. 2B, the plurality of lead sets 22 each including a die lead 22a and bond lead 22b are provided as part of a lead frame 25. A plurality of dies 20 are deposited onto the die leads 22a of the lead sets 22. The dies 20 may be electrically connected to the bond leads 22b of the respective lead sets 22. The electrical connection between the dies 20 to respective bond leads 22b may be made using the wires 21, as disclosed in reference to FIG. 2a.

FIG. 2C shows a bottom view of the package assembly 200 of FIGS. 2A and 2B, after step 11 of the process 100 of FIG. 1. As shown in FIG. 2C, a plurality of lead sets 22 may be arranged in an array configuration. FIG. 2C shows the plating surface 27b (e.g., bottom surface) of the die leads 22a and bond leads 22b of the lead sets 22. As shown, a via 23 is provided in the lead frame 25 between lead sets 22 that are adjacent to each other in an X direction. Although the vias 23 are shown between adjacent lead sets 22 in the X direction in FIG. 2C, it will be understood that vias 23 may be provided in a lead frame 25 in any applicable direction such as the Y direction and that the examples shown in FIGS. 2-8 are not limiting. As further noted herein, lead sets 22 that are adjacent to each other in a Y direction (e.g., top and bottom in FIG. 2C) may be electrically independent from each other during the semiconductor package fabrication, as disclosed herein.

At step 12 of process 100 of FIG. 1 and as shown in FIG. 3, a mold chase 31 taping may be applied to the bottom surface 202 of the package assembly 200. The mold chase 31 may include mold chase extensions 31a that extend into the vias 23 between the lead sets 22, as further disclosed herein. Further, a mold encapsulation 32 may be deposited around the lead frame 25 and other components of the semiconductor die packages and a portion of the mold encapsulation 32 may extend to and terminate at a peak surface 31b of the mold chase extensions 31a. Notably, the mold chase 31 may be applied to the bottom portion 202 of the package assembly 200. The mold chase 31 may prevent the mold encapsulation 32 deposited at step 12 from extending past the base of the lead frame 25 and a portion of the mold encapsulation 32 may extend up to and stop at the peak surface 31b of the mold chase extensions 31a.

As shown in FIG. 3, the mold chase 31 may be applied to the bottom surface 202 of the package assembly 200 and may cover the plating surface 27b of the die lead 22a and bond lead 22b of lead sets 22 of the package assembly 200. The mold chase 31 may include mold chase extensions 31a that extend into the vias 23 (shown in FIGS. 2A-2C) of the lead frame 25. The mold chase extensions 31a may extend partially or fully through the vias 23. As shown in FIG. 3, the mold chase extensions 31a may extend from a first plane parallel to the plating surface 27b of the lead sets 22 to the peak surface 31b of each of the mold chase extensions 31a. The peak surface 31b of each of the mold chase extensions 31a may be parallel to the die surface 27a of the die leads 22a and bond leads 22b of each lead set 22. The mold chase extensions 31a are adjacent to and between the sidewalls 55 of bond leads 22b and sidewalls 56 of die leads 22a of each adjacent lead set 22. As shown in FIG. 3, the mold chase extensions 31a may fill in the entire space between sidewalls 55 and 56. Notably, the mold chase extensions 31a fill the entire surface between the sidewalls 55 and 56 such that the mold encapsulation 32 does not extend into the vias 23 and, therefore, does not cover the sidewalls 55 and 56.

According to an embodiment, the mold chase 31 may be pre-shaped to include mold shape extensions 31a prior to the mold chase 31 being applied to the bottom surface 201 of the package assembly 200. The mold chase 31 may be shaped to include the mold chase extensions 31a through any applicable process such as lithography, etching, annealing, or the like. According to this embodiment, the location of the mold shape extensions 31a may be pre-aligned with the vias 23 of the lead frame 25. According to another embodiment, the mold chase 31 may be applied to the bottom surface 201 of the package assembly 200 and the mold chase extensions 31a may be molded into the vias 23 such that they extend into the vias 23 up to a peak surface 31b of the mold chase extensions 31a, as shown in FIG. 3. According to this embodiment, the material for the mold chase 31 may be malleable such that when pressure and/or heat is applied to the mold chase 31 while the mold chase 31 is on the bottom surface 201 of the package assembly 200, the material of the mold chase 31 extends into the vias 23 to create the mold chase extensions 31a. As shown in FIG. 3, the mold chase extensions 31a may be shaped as a convex bulge that is shaped to fill the vias 23.

As shown in FIG. 3, at step 13 of the process 100 of FIG. 1 dies 20 and other components (e.g., wires 21) may be encapsulated within the mold encapsulation 32 (also referred to as a "molding," "mold," "encapsulation," "encapsulation material," "mold encapsulation material", or other similar term herein). The mold encapsulation 32 may be non-conductive and may cover all or most of the package components but may not cover the plating surface 27b of the die leads 22a and bond leads 22b of each lead set 22 and may also not cover the sidewalls 55 of bond leads 22b and sidewalls 56 of die leads 22a as a result of being blocked from doing so by the mold chase extensions 31a. The mold encapsulation 32 may include a top major surface 32a that is opposite to the bottom surface 27b of the die leads 22a and bond leads 22b of each lead set 22. The mold encapsulation 32 may have a bottom major surface 32b that is adjacent and substantially parallel to the bottom surface 27 of the plurality of the die leads 22a and bond leads 22b of each lead set 22 except for the vias 23.

Portions of mold encapsulation 32 are shown in FIG. 3, though it will be understood that the mold encapsulation 32 may cover the lead frame 25 and associated components (e.g., dies 20 and wires 21), as seen from the cross-sectional view shown in FIG. 3. In an embodiment, the mold encapsulation 32 may be partially or fully opaque and may be of a given color (e.g., black, grey, etc.) such that the lead frame 25 and associated components may not be visible from a top view. However, it will be understood that in the top view, as shown in FIG. 3, the mold encapsulation 32 is shown as transparent for illustrative purposes, such that the lead frame and associated components are visible in FIG. 2A. As shown, mold encapsulation 32 encapsulates the dies 20, plurality of leads die leads 22a and bond leads 22b of each lead set 22 and may be provided between the space between die leads 22a and bond leads 22b of each lead set 22.

The mold encapsulation 32 may provide a physical and electrical barrier for the components of the package assembly 200. The mold encapsulation 32 may be a silica-filled resin, a ceramic, a halide-free material, or other protective encapsulation material, or a combination thereof. The mold encapsulation 32 may be formed by molding thermosetting materials in a process where a plastic is softened by heat and pressure in a transfer chamber, then forced at high pressure through suitable sprues, runners, and gates into a closed mold for final curing. The mold encapsulation 32 may also be formed by using a liquid which may be heated to form a solid by curing in a UV or ambient atmosphere, or by using a solid that is heated to form a liquid and then cooled to form a solid mold.

According to an embodiment, as shown in FIG. 3, prior to the mold chase 31 being applied, a film 30 may be applied to the plating surface 27b of each of the die leads 22a and bond leads 22b and the film 30 may extend into the vias 23 such that it covers the sidewalls 55 and 56. The film 30 may also extend between gaps between die leads 22a and bond leads 22b of each lead set 22, as shown in FIG. 3. According to this embodiment, the mold chase 31 may be applied to the surface of the film 30 that is opposite from the plating surface 27b of the die leads 22a and bond leads 22b of lead sets 22. Accordingly, the mold chase 31 may cover the film 30 below the plating surface 27b and the mold chase extensions 31 may cover the film 30 within the vias 23. Alternatively, the film 30 may be applied to a pre-shaped mold chase 31 prior to the mold chase 31 being applied to the bottom surface 201 of the package assembly 200.

Figure 4:
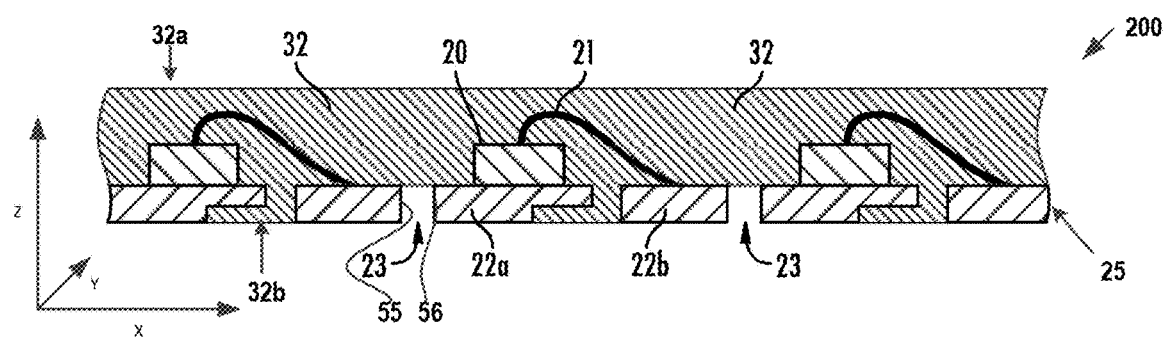
FIG. 4 is a cross-sectional view of the package assembly of FIG. 3 with the mold chase removed, according to an example.

At step 13 of the process 100 of FIG. 1, the film 30 and/or mold chase 31 may be removed from the lead frame 25, after step 12, as shown in FIG. 4. One or more markings (not shown) may be applied to the lead frame assembly 200. The markings may include one or more fiducial marks which are marks detectable by a machine that allow the machine to align itself for cutting. After step 13, a package assembly 200 is provided that includes multiple non-singulated semiconductor die packages with package components (e.g., dies, the lead frame, and the components that couple the dies to the lead frame) encapsulated within a molding material 32. Notably, as shown in FIG. 4 the plating surface 27b of the die leads 22a and bond leads 22b of each lead set 22 may be exposed. Further, the sidewalls 55 of bond leads 22b and sidewalls 56 of die leads 22a may also be exposed, as shown in FIG. 4.

Figure 5:
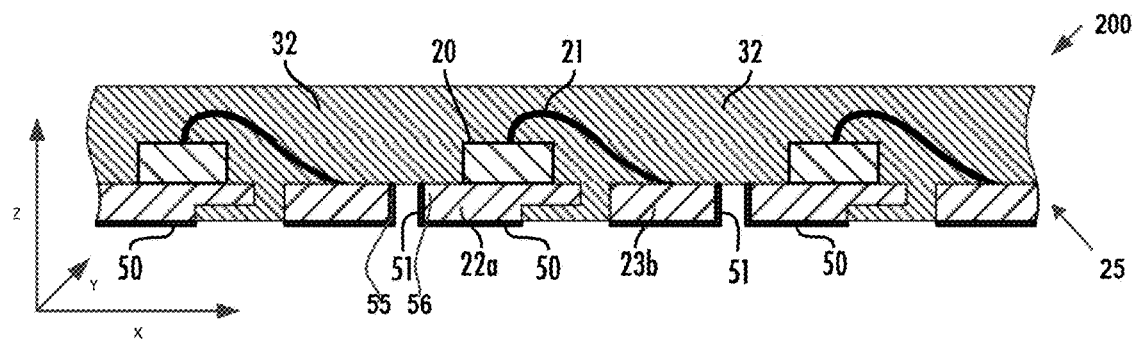
FIG. 5 is a cross-sectional view of the package assembly with a plating surface electrical plating and sidewall electric plating, according to an example.

At step 14 of the process 100 of FIG. 1, the plating surface 27b of the plurality of die leads 22a and bond leads 22b of each lead set 22 as well as the sidewalls 55 of bond leads 22b and sidewalls 56 of die leads 22a may be plated with an electrical plating 50 and electrical plating 51, respectively, as shown in FIG. 5. As disclosed herein, the plating surface 27b of the plurality of die leads 22a and bond leads 22b of each lead set 22 may be the surface that is opposite from the surface of the plurality of die leads 22a and bond leads 22b of each lead set 22 that is bonded to the wires 21 deposited at step 11. Notably, the plating surface 27b and the sidewalls 55 of bond leads 22b and sidewalls 56 of die leads 22a surfaces that are exposed after the removal of the film 30 and/or mold chase 31.

The electrical plating 50 and electrical plating 51 may be the same or may include two different electrical plating materials. The electrical plating 50 and electrical plating 51 may be applied at the same time or in two different steps. The electrical plating 50 and electrical plating 51 may be applied by an electroplating process, at step 14 of the process 100 of FIG. 1, as shown in FIG. 5. The electrical plating 50 and/or electrical plating 51 may include one or more layers of a metal, such as tin or a tin alloy, plated on the plating surface 27b of the plurality of die leads 22a and bond leads 22b of each lead set 22 (i.e., electrical plating 50) as well as the sidewalls 55 of bond leads 22b and sidewalls 56 of die leads 22a (i.e., electrical plating 51) and may protect the plating surface 27b and sidewalls 55 and 56 from oxidation. Further, the electrical plating 50 and/or electrical plating 51 may provide a wettable surface for soldering. Application of the electrical plating 50 and/or electrical plating 51 in the electroplating process may include depositing a conductive plating material that covers the plating surfaces 27b (e.g., bottom surface) and/or sidewalls 55 and 56 and allows for solder to adhere to the plurality of die leads 22a and bond leads 22b of each lead set 22 as well as the sidewalls 55 of bond leads 22b and sidewalls 56 of die leads 22a. An electrical plating 50 and/or electrical plating 51 material may be deposited on the exposed plating surfaces 27b and sidewalls 55 and 56. During the electroplating process of step 14, the lead frame 25 may be dipped in a bath and the lead frame 25 may be electrically coupled to the cathode of an electrolytic plating device (not shown). The anode of the electrolytic plating device may be coupled to the plating material, which is also dipped in the bath. An electrical current may be applied to the lead frame which causes the plating material to be deposited on the plating surface 27b of the plurality of die leads 22a and bond leads 22b of each lead set 22 as well as the sidewalls 55 of bond leads 22b and sidewalls 56 of die leads 22a so that, for example, the plating surface 27b of the plurality of die leads 22a and bond leads 22b of each lead set 22 as well as the sidewalls 55 of bond leads 22b and sidewalls 56 of die leads 22a are plated with the plating material. The electrical plating 50 material may be any of a variety of plating materials, such as tin, gold, palladium, or silver.

Figure 6:
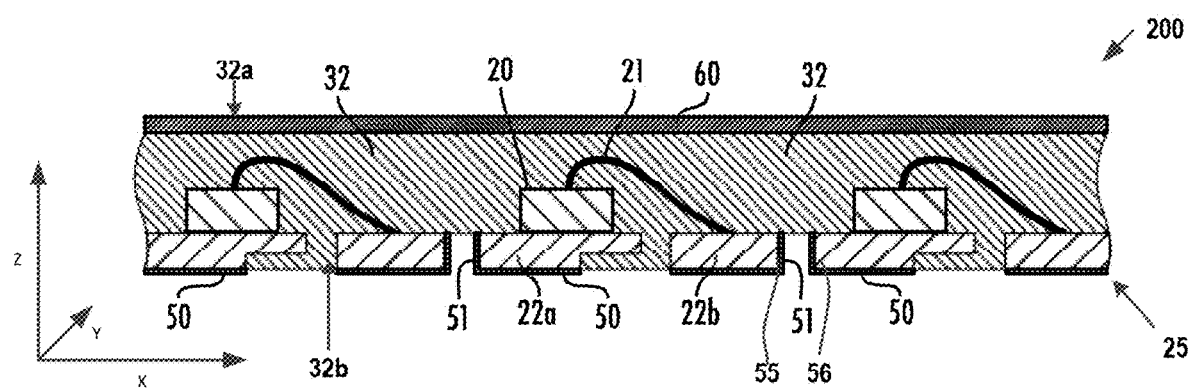
FIG. 6 is a cross-sectional view of the package assembly with a connecting film, according to an example.

At step 15 of the process 100 of FIG. 1, a connecting film 60 may be applied to the top major surface 32a of the mold encapsulation 32, as shown in FIG. 6. As shown, the connecting film 60 may be applied over a plurality of the lead sets 22. The connecting film 60 may be any applicable film that attaches to the top major surface 32a of the mold encapsulation 32. The connecting film 60 may attach to the top major surface of the mold encapsulation 62 using any applicable adhesive material.

Figure 7A:
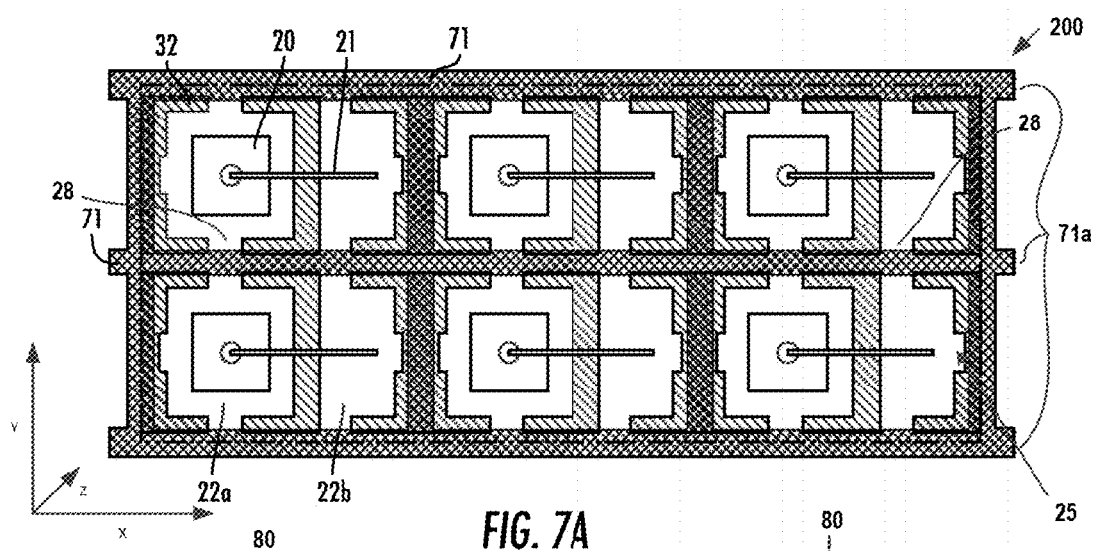
FIG. 7A is a top view of package assembly illustrating the cuts and cutting pattern that create channels within the package assembly, according to an example.
Figure 7B:
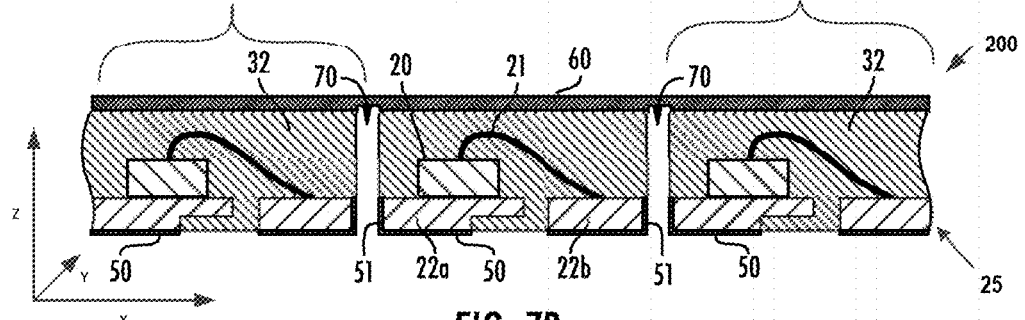
FIG. 7B is a cross-sectional view of the package assembly of FIG. 7A, according to an example.
Figure 7C:
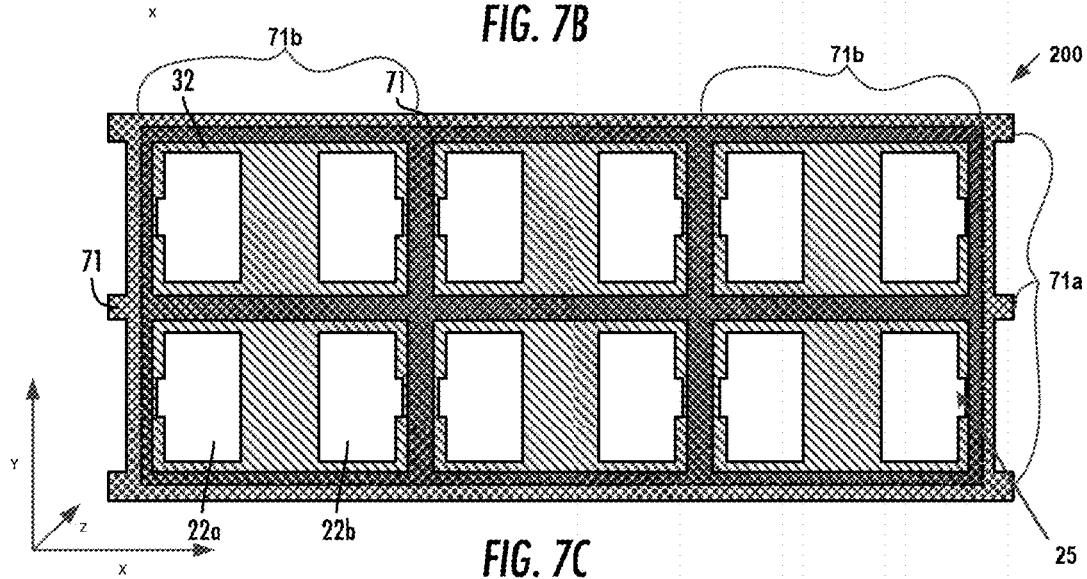
FIG. 7C is a bottom view of the package assembly of FIG. 7A, according to an example.

At step 16 of the process 100 of FIG. 1 a singulation process may be applied, as shown in FIGS. 7A-7C. As shown in FIGS. 7A-7C, the lead frame 25 may be singulated into individual semiconductor die packages 80 after step 16. The singulation process at step 16 may be implemented using an applicable cutting device and/or technique such as a saw having a saw blade, or a laser cutter, a plasma cutter, or a water jet cutter, or any other acceptable cutting device and/or technique as known to those of skill in the art. As further described herein, the singulation process at step 16 may include making one or more cuts 71 (e.g., 71a and/or 71b). Cuts 71a may extend in an X direction (e.g., from a left side to a right side of the package assembly 200 shown in FIGS. 7A and 7C), and start from a bottom major surface 32b of the mold encapsulation 32 and extend up through the top major surface 32a of the mold encapsulation 32. According to an embodiment, the cuts 71a may also cut through lead connectors 28, as shown in FIG. 7A. As applied herein, lead connectors 28 may connect two adjacent leads and may be part of a lead frame (e.g., lead frame 25) itself or may be formed from one or more other materials. Cuts 71b may be made between adjacent lead sets 22 and may extend in the Y direction and be made through the vias 23 starting at the bottom surface of the mold encapsulation 32 that corresponds the peak surfaces 31*b* of removed mold chase extensions 31*a*, and may extend through the top major surface 32*a* of the mold encapsulation 32 to create one or more channels 70. The channels 70 may each include the sidewalls 55 and 56 plated with electrical plating 51, on each side of each of a portion of the channels 70. After the singulation process at step 16, the package assembly 200 may be singulated into individual semiconductor die packages 80 connected only by the connecting film 60. According to embodiments, a portion of the channels 70 that does not correspond to the vias 23 is smaller than the vias 23 (e.g., the walls of the channels 70 have a width that is less than the distance between sidewall 55 to sidewall 56).

FIG. 7B shows a cross-section view of the package assembly 200 of FIG. 7A, during step 16 of the process 100 of FIG. 1. FIG. 7B shows a series of parallel cuts 71*b* made in the Y direction to create a plurality of channels 70. Notably, the series of parallel cuts 71*b* in the Y direction start at the vias 23 and extend through the mold encapsulation 22. FIG. 7B shows the channels 70 extending partially into the connecting film 60, though it will be understood that, according to an embodiment, the channels 70 may be formed up to, but not through a portion of the connecting film 70. As shown in FIG. 7B, at least a portion of the connecting film 60 is contiguous over the major peak surface 32*a* of the mold encapsulation 32 across multiple lead sets 22.

As shown in the bottom view of FIG. 7C, the singulation process at step 16 may include making a first series of parallel cuts 71*a* along a first direction (e.g., an X direction) cutting through the bottom major surface 32*b* of the mold encapsulation 32. The first series of parallel cuts may extend to a depth up to the connecting film 60 or a portion of the connecting film 60. Notably, this first series of parallel cuts 71*a* only cut through lead connectors 28 and/or the area between adjacent electrically unconnected lead sets 22 (e.g., leads arranged above or below each other if viewing the package assembly 200 from a top view, as shown in FIG. 7A or from a bottom view as shown in FIG. 7C), and do not cut through the lead sets 22. The singulation process at step 16 may further include making a second series of parallel cuts 71*b* along a second direction (e.g., a Y direction), the second direction substantially perpendicular to the first direction. The second series of parallel cuts 71*b* may starting from the vias 23 and, specifically, from the bottom surface of the mold encapsulation 32 that corresponds to the peak surfaces 31*b* of removed mold chase extensions 31*a*, and may extend through the top major surface 32*a* of the mold encapsulation 32 to a depth up to the connecting film 60 or a portion of the connecting film 60 to create channels 70.

The first and second series of parallel cuts 71*a* and 71*b* may be made up to a depth that does not extend fully through the connecting film 60, to allow the semiconductor die packages 80 to remain as a single package assembly 200 during the singulation process at step 16. Notably, the connecting film 60 may have properties (e.g., strength, rigidity, elasticity, etc.) that enable the connecting film 60 to maintain the plurality of semiconductor die packages 80 of the package assembly 200, that are separated by the channels 70, to remain as part of a single unit connected by the connecting film 60. For example, the connecting film 60 may enable the semiconductor die packages 80 of the package assembly 200 plus the plurality of channels 70 to have a width, in an X direction, that is substantially equal to the width of the package assembly 200 before the singulation at step 16 (e.g., the width of the package assembly 200 prior to step 16, as shown in FIG. 6). The connecting film 60 may be made from any applicable material that may or may not conduct electricity.

Alternatively, according to an embodiment, at step 16, instead of taping the top surface 201 of the package assembly 200 with connecting tape 60, the connecting tape 60 may be applied to the bottom surface 202 of the package assembly 200 (not shown). For example, the singulation process at step 16 may include making one or more of the cuts 71 (e.g., 71*a* and/or 71*b*) from the top major surface 32*a* of the mold encapsulation 32 while the connecting tape 60 is applied to the bottom surface 202. According to this embodiment, cuts 71*a* may extend in an X direction, and start from the top major surface 32*a* of the mold encapsulation 32 and extend down through the mold encapsulation to a bottom major surface 32*b* of the mold encapsulation 32. According to an embodiment, the cuts 71*a* may also cut through a portion of the lead frame 25 (e.g., if the lead connectors 28 are part of the lead frame 25). Cuts 71*b* may be made between adjacent lead sets 22 and may extend in the Y direction and be made through the vias 23 starting at the top major surface 32*a* of the mold encapsulation 32 and extend down through the mold encapsulation 32 to a bottom surface of the mold encapsulation 32 that corresponds to the peak surfaces 31*b* of removed mold chase extensions 31*a*, to create one or more channels 70. The channels 70 may each include the sidewalls 55 and 56 plated with electrical plating 51, on each side of each of a portion of the channels 70. According to embodiments, a portion of the channels 70 that does not correspond to the vias 23 is smaller than the vias 23 (e.g., the walls of the channels 70 have a width that is less than the distance between sidewall 55 to sidewall 56).

Figure 8:
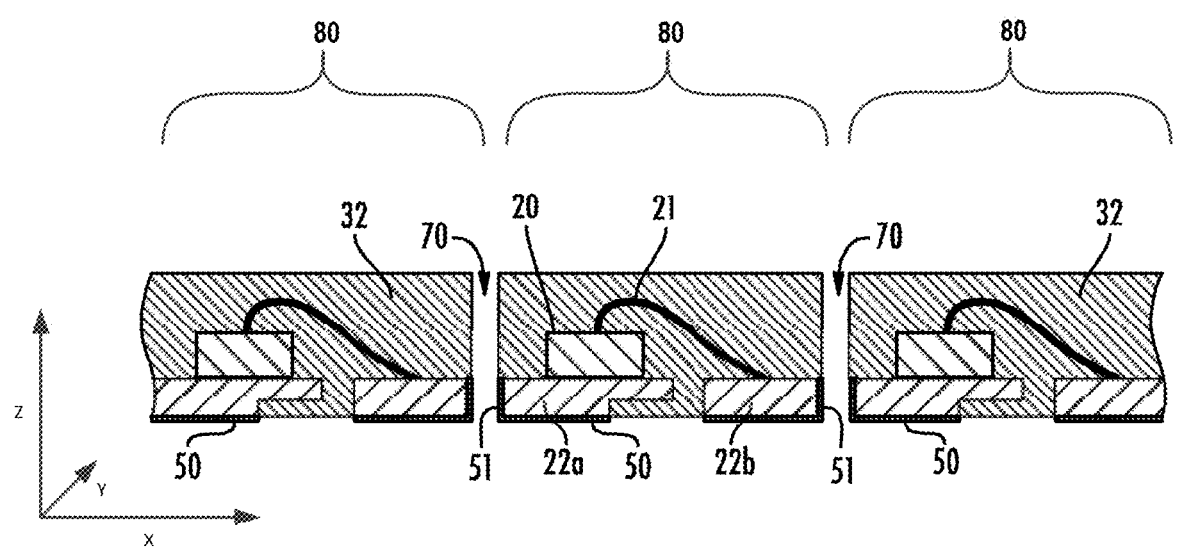
FIG. 8 is a cross-sectional view of finished semiconductor die packages with bottom and sidewall electric plating, according to an example.

At step 17 of the process 100 of FIG. 1, the connecting film 60 is removed, as shown in FIG. 8. As shown, after removal of the connecting film 60 at step 17, only the plurality of semiconductor die packages 80, of package assembly 200, remain. Each of the plurality of semiconductor die packages 80 include a lead set 22 with a die lead 22*a* and a bond lead 22*b*, a die 20 bonded to each die lead 22*a* of each lead set 22, a wire 21 electrically connecting the die 20 to a corresponding bond lead 22*b* of each lead set 22. Additionally, each of the plurality of semiconductor die packages 80 include electrical plating material (e.g., electrical plating material 50) on the plating surfaces 27*b* of the die leads 22*a* and bond leads 22*b*, and as well as the lead sidewalls 55 and 56 (e.g., electrical plating material 51) of each lead set 22. The electrical plating material (e.g., 50 and/or 51) may serve to mount a given semiconductor die package to a printed circuit board (PCB).

Although a specific number and configuration of leads in lead sets (e.g., die leads 22*a* and bond leads 22*b* in lead sets 22) is shown and/or described herein, the techniques of the present disclosure are applicable to assembly packages having any configuration of leads and/or dies. Additionally, it is understood by one in the art that the same or similar techniques may be applied to provide QFN packages with wettable flanks as DFN packages with wettable flanks.

Figure 9A:
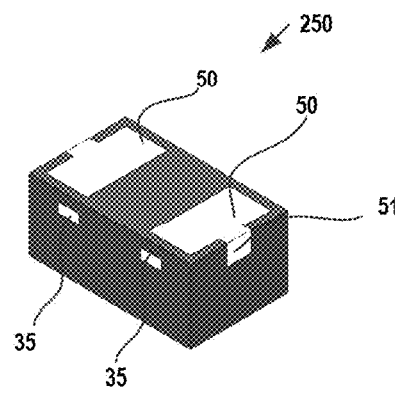
FIG. 9A is a perspective view of a bottom side of a DFN package with bottom and sidewall plating, according to an example.
Figure 9B:
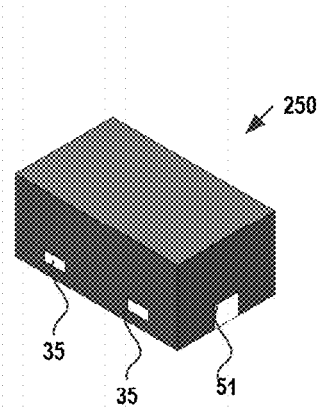
FIG. 9B is perspective view of a top side of the DFN package of FIG. 9A with bottom and sidewall plating, according to an example.

FIGS. 9A and 9B show a DFN package with wettable flanks 250 with a first electrical plating material 50 on the bottom of two corresponding leads (not shown) as well as a second electrical plating 51 on the lead sidewalls (not shown) of the DFN package 250. The first plating material 50 and the second plating material 51 may be plated in accordance with the process 100 of FIG. 1, as disclosed herein. Additionally, as shown in FIG. 9A a tie bar area 35 may also be plated (e.g., with second electrical plating 51). The tie bar area 35 may assist with, as disclosed herein, forming an electrical connection for current flow during electroplating (e.g., during the first electrical plating 50 and/or second electrical plating 51.

Figure 9C:
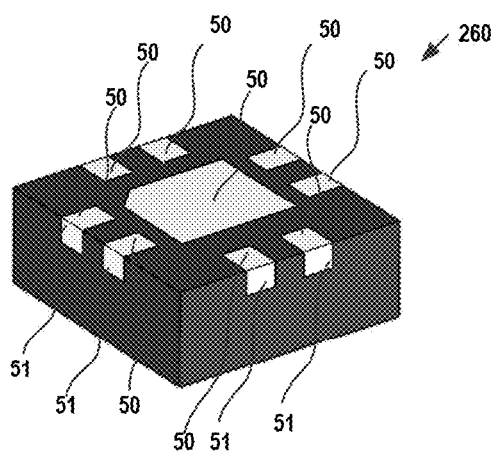
FIG. 9C is a perspective view of a bottom side of a QFN package with bottom and sidewall plating, according to an example.
Figure 9D:
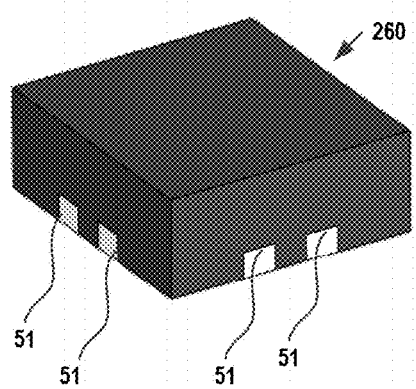
FIG. 9D is a perspective view of the top side of the QFN package of FIG. 9C with bottom and sidewall plating, according to an example.

FIGS. 9C and 9D show a QFN package 260 with a first electrical plating material 50 on the bottom of corresponding leads (not shown) as well as a second electrical plating 51 on the lead sidewalls (not shown) of the QFN package 260. The first plating material 50 and the second plating material 51 may be plated in accordance with the process 100 of FIG. 1, as disclosed herein.

Notably, the process 100 of FIG. 1, as described herein, provides a plating process to form semiconductor die package having wettable flanks. The process 100 provides for plating prior to singulating by using a mold chase with mold chase extensions to isolate vias during application of a mold encapsulation and then expose the sidewalls and plating surfaces of leads after removal of the mold chase. Plating prior to singulation may allow for a simplified plating process and may reduce the complexity of singulating then plating.

It will be appreciated that the foregoing is presented by way of illustration only and not by way of any limitation. It is contemplated that various alternatives and modifications may be made to the described embodiments without departing from the spirit and scope of the invention. Having thus described the present invention in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiment and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. A method for fabricating lead wettable surfaces, the method comprising:
    providing a lead frame comprising a plurality of lead sets, each lead set comprising a die lead and bond lead having a die surface and a plating surface, vias between adjacent lead sets in a first direction, and an integrated circuit die arranged on the die surface of each die lead;
    applying a mold chase to the plating surface of each of the die leads and the bond leads, the mold chase contacting the plurality of lead sets, the mold chase comprising mold chase extensions extending into the vias between each adjacent lead set in the first direction, each mold chase extension having a peak surface;
    partially embedding the lead frame assembly in a mold encapsulation such that portions of the mold encapsulation contact the peak surface of each of the mold chase extensions;
    removing the mold chase to expose the vias, each via comprising a first lead sidewall of the die lead of each lead set and the second lead sidewall of the bond lead of each lead set; and
    plating the plating surface of each of the die leads and the bond leads and plating the first lead sidewall and the second lead sidewall with an electrical plating.

2. The method of claim 1 further comprising:
    applying a connecting film to a top major surface of the mold encapsulation;
    singulating the lead frame assembly into individual semiconductor die packages, the singulating comprising:
        making a first series of parallel cuts, along a second direction that is substantially perpendicular to the first direction, from the vias and through the top major surface of the mold encapsulation, to a depth up to the connecting film or a portion of the connecting film;
        making a second series of parallel cuts along the first direction through a surface of the mold encapsulation that is opposite the connecting film, to a depth up to the connecting film or a portion of the connecting film; and
    removing the connecting film.

3. The method of claim 1 further comprising:
    applying a connecting film to a bottom major surface of the mold encapsulation;
    singulating the lead frame assembly into individual semiconductor die packages, the singulating comprising:
        making a first series of parallel cuts, along a second direction that is substantially perpendicular to the first direction, from the top major surface of the mold encapsulation and to the vias;
        making a second series of parallel cuts along the first direction from the top major surface of the mold encapsulation to a depth down to the connecting film or a portion of the connecting film; and
    removing the connecting film.

4. The method of claim 1, wherein the mold chase extensions extend from a first plane parallel to the plating surface of the die lead and the bond lead to the peak surface of each of the mold chase extensions, such that the peak surface of each of the mold chase extensions is parallel to the die surface of the die lead and bond lead in each lead set.

5. The method of claim 1, wherein a portion of the mold chase is contiguous across the plurality of lead sets.

6. The method of claim 1, wherein the die lead and the bond lead in each lead set is electrically connected by a wire.

7. The method of claim 1, wherein the electrical plating comprises at least one of a tin material and a tin alloy material.

8. The method of claim 1, wherein the plating comprises:
    providing a plating material solution on the plating surface of the die lead and the bond lead of each lead set, on the first lead sidewall, and on the second lead sidewall,
    electrically coupling a power source to the lead frame and to the plating material solution, and
    applying current to the lead frame via the power source.

9. The method of claim 1, wherein the mold chase extensions are shaped as convex budges.

10. The method of claim 1, wherein the mold chase extensions are formed using one or more of lithography, etching, and annealing.

\* \* \* \* \*